United States Patent [19]

Hudson, III

[11] Patent Number: 4,756,382

[45] Date of Patent: Jul. 12, 1988

[54] LOUDSPEAKER HAVING ENHANCED RESPONSE AT BASS FREQUENCIES

[76] Inventor: Joseph L. Hudson, III, 806 N.W. 61st, Seattle, Wash. 98107

[21] Appl. No.: 20,787

[22] Filed: Mar. 2, 1987

[51] Int. Cl.[4] ................................ H05K 5/00

[52] U.S. Cl. ................................ 181/156; 181/141; 181/153

[58] Field of Search ............... 181/153, 156, 199, 141, 181/144

[56] References Cited

U.S. PATENT DOCUMENTS

| | | | |
|---|---|---|---|
| 2,002,390 | 5/1935 | Crosley, Jr. et al. | 181/144 X |
| 3,512,606 | 5/1970 | Anastin | 181/144 |
| 4,146,744 | 3/1979 | Veranth | 181/156 X |
| 4,284,166 | 8/1981 | Gale | 181/156 |
| 4,472,605 | 9/1984 | Klein | 181/153 X |
| 4,567,959 | 2/1986 | Prophit | 181/156 |

*Primary Examiner*—B. R. Fuller
*Attorney, Agent, or Firm*—Christensen, O'Connor, Johnson & Kindness

[57] ABSTRACT

A loudspeaker is disclosed having an enhanced response at bass frequencies. The loudspeaker includes a tubular enclosure having a pair of outwardly directed, opposing loudspeaker drivers mounted over each end. A port is provided through the enclosure midway between the drivers and is coupled to the exterior of the loudspeaker by a perpendicularly projecting duct. The length and cross-sectional area of the duct, as well as the enclosure, are selected to describe an acoustic cavity having a predetermined mechanical resonance. The opposing nature of the drivers, spaced apart by the continuous curved walls of the enclosure, reduces spurious resonances within the enclosure. In addition, the resultant T-shaped configuration of the loudspeaker maintains the loudspeaker substantially stationary in a moving vehicle without the need for auxiliary fastening devices. In other arrangements, a longitudinally extending duct having a crescent-shaped cross section is employed instead of the perpendicularly projecting duct and the cross section of the enclosure may, for example, be elliptic rather than circular.

3 Claims, 3 Drawing Sheets

LOUDSPEAKER HAVING ENHANCED RESPONSE AT BASS FREQUENCIES

FIELD OF THE INVENTION

This invention relates generally to the design of loudspeakers having an enhanced response at bass frequencies.

BACKGROUND OF THE INVENTION

The desire to provide highly accurate, electronic reproductions of sound has led to the development of numerous designs for loudspeakers able to convert electronic energy into acoustic energy. Typically, a complete high fidelity audio system includes at least two loudspeakers, each of which is designed to produce sound over substantially the entire audio spectrum. Because the accurate reproduction of sound within different ranges of the audio spectrum may place conflicting constraints on loudspeaker design, each loudspeaker frequently includes a number of electromechanical drivers separately designed to output acoustic energy within predetermined frequency ranges. For example, in a three-way system, each loudspeaker includes three drivers for separately reproducing sounds in the low, middle, and high-frequency ranges of the audio spectrum. Alternatively, the high fidelity audio system may employ a plurality of loudspeakers separately designed to accurately reproduce sound within various frequency ranges.

One such loudspeaker, designed to reproduce sound at low or bass frequencies, is disclosed in U.S. Pat. No. 4,567,959. The disclosed loudspeaker includes a loudspeaker transducer or driver secured to a first, open end of an elongate tube. The end of the tube opposite the driver is closed by a flat wall. A port is provided through the tube wall adjacent the closed end of the tube and is covered by a bass-reflex duct, connected to and extending along the length of the tube. The end of the duct that is adjacent the closed end of the tube is also closed, while the end of the duct adjacent the loudspeaker driver is open. When electric energy is applied to the driver, acoustic energy is directly radiated from the outwardly facing surface of the driver cone. Acoustic energy developed by the inner surface of the driver cone, on the other hand, is primarily transmitted progressively through the tube, port, and duct. Because this supplemental energy reaches the listener's environment at the open end of the duct, the inclusion of the port and duct allows electric energy to be converted into acoustic energy in a more efficient manner than a closed-tube design.

The loudspeaker disclosed in U.S. Pat. No. 4,567,959 is intended to be acoustically loaded by placing the end of the loudspeaker including the driver and open duct approximately three inches from one of the facing walls of a corner. This placement allows the loudspeaker to provide a bass response that is enhanced in comparison to an ordinary free-standing acoustic suspension or bass-reflex speaker. Because of the manner in which the speaker is acoustically loaded, it is important that the audio energy emanate from only the plane of the driver and duct opening.

Although the loudspeaker design described above does provide an enhanced response at bass frequencies, it is not without several problems. First, the acoustic pressure variations established by the driver cone within the tube are typically sufficient to cause the flat, closed end of the tube to vibrate. As a result, spurious resonances are created at the lower audible frequencies, producing undesirable irregularities in the frequency response of the loudspeaker. While these resonances can be minimized by increasing the rigidity of the tube, correction in this manner may add significantly to the weight and expense of the loudspeaker.

A second disadvantage of the loudspeaker design described above is that the sound originates from one plane. While this allows the loudspeaker to be corner loaded more easily, it may impair the authenticity of a high fidelity reproduction when the sounds being reproduced did not originally come from a point source.

Finally, U.S. Pat. No. 4,567,959 describes the disclosed loudspeaker design as having particular applicability to the interior of a vehicle. As will be appreciated, due to the frequent changes in velocity experienced by a moving vehicle, a tubular loudspeaker having its longitudinal axis placed normal to the direction of travel will tend to roll when the vehicle accelerates or decelerates. Thus, some means for securing the loudspeaker in place is required. This necessity is complicated by the fact that most of the surface of the tube that can be used to make the attachment is curved.

In light of the foregoing considerations, it would be desirable to produce a loudspeaker having an enhanced bass frequency response that eliminates spurious resonances, emits sound from more than one plane, and that can be stably situated in an environment undergoing motional changes.

SUMMARY OF THE INVENTION

In accordance with this invention, a loudspeaker is disclosed including an enclosure having first and second open ends. A first driver element for converting electric energy into acoustic energy is secured to the first open end of the enclosure. A second driver element, also for converting electric energy into acoustic energy, is secured to the second open end of the enclosure. In accordance with a particular aspect of this invention, the enclosure has a port, located between the first and second open ends, that provides acoustic communication between the interior and exterior of the enclosure. The port is located a substantially equal distance from both the first and second open ends of the enclosure. A duct, secured to the enclosure, acoustically coupled the port with the exterior of the enclosure. In a preferred arrangement, the duct projects outward from the enclosure, substantially perpendicular to the longitudinal axis of the enclosure, and has a substantially rectangular cross section. The enclosure, on the other hand, preferably has a substantially circular cross section.

BRIEF DESCRIPTION OF THE DRAWINGS

The invention will presently be described in greater detail, by way of example, with reference to the accompanying drawings wherein.

DETAILED DESCRIPTION OF THE PREFERRED EMBODIMENTS

Figure 1:
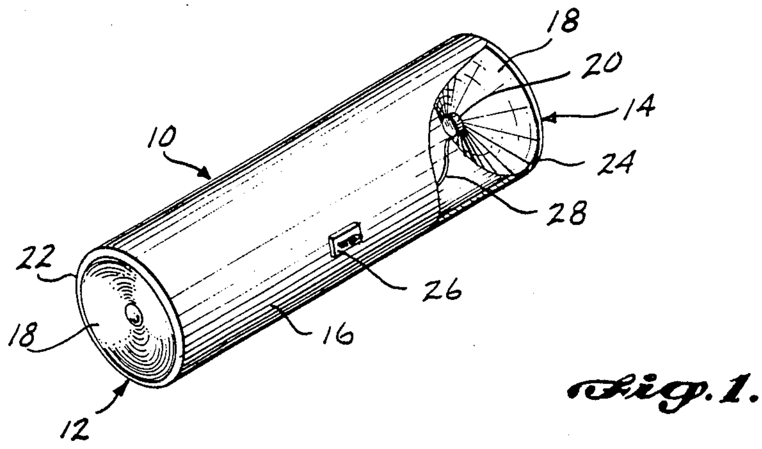
FIG. 1 is a pictorial view, in partial section, of a loudspeaker constructed in accordance with this invention and including a hollow tubular enclosure having a loudspeaker driver secured to each end.

Referring now to FIG. 1, a loudspeaker 10 constructed in accordance with this invention is illustrated. As shown, loudspeaker 10 includes a pair of loudspeaker drivers 12 and 14 secured to the ends of a single tubular enclosure 16. As will be discussed in greater detail below, drivers 12 and 14 cooperate with enclosure 16 to produce an enhanced low-frequency or bass response of loudspeaker 10 to the input of electric energy.

Addressing the components of loudspeaker 10 individually, drivers 12 and 14 are preferably of a moving-coil construction having a cone or diaphragm 18 coupled to a voice coil assembly 20. The application of an audio-frequency current to the voice coil assembly 20 establishes a magnetic field that interacts with a fixed, permanent magnetic field developed in the voice coil assembly 20 to produce motion of the cone 18. The amplitude and frequency of the cone's motion are determined by the current applied to the voice coil assembly 20. The motion of cone 18 compresses and rarefies the air in front of cone 18, producing an audible tone having a loudness that corresponds to the amplitude of the input current and a pitch corresponding to the frequency of the current.

Although various sizes and shapes of the drivers 12 and 14 can be employed, the two drivers are preferably similarly constructed. Drivers employing circular cones 18 typically have a diameter falling within the range of 15 to 46 centimeters. The particular size selected depends upon a number of factors including the operational specifications of the equipment available to supply electrical energy to the voice coil assembly 20 of the driver, the listening environment in which the loudspeaker 10 is to be employed, and the preferences of the listener situated in the environment. Generally, however, with larger diameter drivers 12 and 14 employed, greater compressions and rarefactions of the adjacent air can be established, allowing louder sounds to be produced.

As shown in FIG. 1, drivers 12 and 14 are secured to the open ends 22 and 24 of the tubular enclosure 16. Enclosure 16 is preferably made of a material that is sufficiently rigid to exhibit negligible vibration when drivers 12 and 14 are operated at their maximum levels. As will be appreciated, the elimination of the flat, closed end of prior art loudspeakers leaves only the continuous curved surface of enclosure 16 exposed to the internal pressure variations established by drivers 12 and 14. Given the relative strength of this configuration, a thinner, less rigid material can be suitably employed. In the preferred arrangement, polyvinyl chloride is used.

As shown in FIG. 1, enclosure 16 has a circular cross section corresponding in diameter to that of drivers 12 and 14. While it is preferred that the cross section of enclosure 16 match the shape of drivers 12 and 14, various enclosure cross sections could be employed. The length of enclosure 16 is determined in accordance with the understanding of closed resonant cavities provided by classical physics. As will be appreciated, the use of opposing drivers 12 and 14 mounted at opposite ends of enclosure 16 effectively reduces the length of the resonant cavity behind each driver 12 and 14 by one-half. Thus, the effective dimensions of the resonant cavity behind each driver 12 and 14 is determined by the diameter of the enclosure and one-half of its length.

As noted previously, drivers 12 and 14 are mounted to the open ends of enclosure 16, with the cone 18 of each driver opening to the exterior of the enclosure 16. With the drivers sealingly secured to the openings of an enclosure 16, as shown in FIG. 1, the majority of the acoustic energy transmitted by loudspeaker 10 to the surrounding air comes from the exposed faces of the driver cones 18. While additional energy is transmitted to the interior of the enclosure 16 by the inner faces of cones 18, the resultant pressure variations are contained within the enclosure 16 and, given the symmetry of the arrangement, produce a cancelling effect midway between the drivers 12 and 14.

Output terminals 26 are included on the exterior surface of enclosure 16 and are connected by wires 28 to the voice coil assemblies 20 of each driver 12 and 14. In this manner, loudspeaker 10 can easily be connected to the incoming lead wires from an audio signal source.

A loudspeaker 10, constructed in the manner described above and shown in FIG. 1, has several advantages over the loudspeaker disclosed in U.S. Pat. No. 4,567,959. More particularly, by eliminating the mechanical closed end of the enclosure, the spurious resonances established by vibration of the closed end are removed. The symmetric alignment of the drivers establishes an "effective" wall midway between the ends of enclosure 16, enhancing the response of loudspeaker 10. In addition, the loudspeaker 10 illustrated in FIG. 1 no longer emits sounds from a single reference point or plane. Thus, a fuller, more accurate reproduction can be achieved for sounds whose original source is not a single point or plane.

Figure 2:
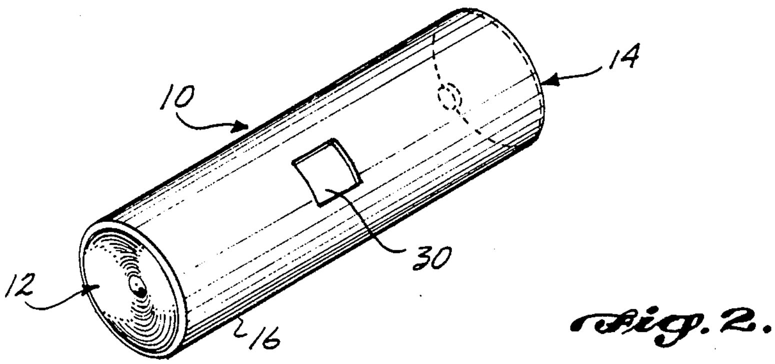
FIG. 2 is a pictorial view of an alternative embodiment of the loudspeaker illustrated in FIG. 1, including a port provided in the enclosure midway between the drivers secured at each end.

When constructed as shown in FIG. 1, the stiffness of the enclosure 16 raises the frequency of mechanical resonance of the loudspeaker 10 somewhat, causing the low-frequency response of loudspeaker 10 to fall off at a higher frequency than if the driver were mounted to an infinite baffle in which all of the energy radiated from the driver comes only from the front of the cone 18. To lower the frequency of mechanical resonance, the mechanical stiffness of enclosure 16 can also be lowered. One way of accomplishing this is to include a port 30 in the enclosure 16 midway between drivers 12 and 14 as shown in FIG. 2. The dimensions and shape of port 30 can be varied to alter the mechanical resonance of the enclosure 16 as desired. As will be appreciated, port 30 provides a path of acoustic communication between the interior and exterior of enclosure 16, allowing some of the energy radiated by the rear surface of the cone 18 of each driver 12 and 14 to be emitted from the loudspeaker 10.

Figure 3:
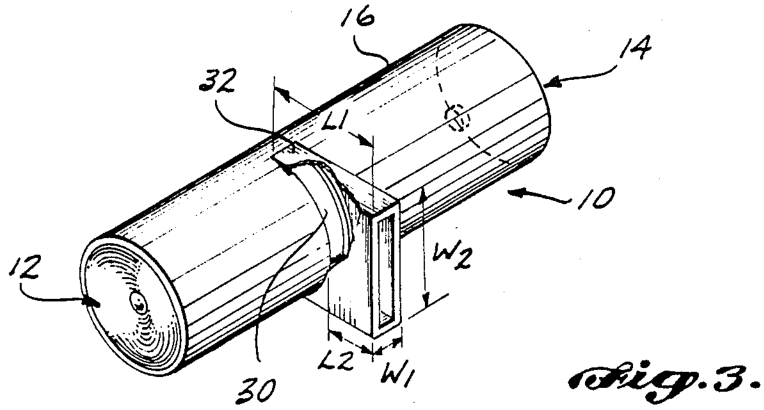
FIG. 3 is a pictorial view, in partial section of another alternative embodiment of the loudspeaker illustrated in FIG. 1, including a port and a perpendicularly extending duct for acoustically coupling the interior of the enclosure with the exterior of the enclosure.

While loudspeaker 10 could be constructed as shown in FIG. 2, port 30 provides limited control over the resonance of enclosure 16. To allow the response of enclosure 16 to be more accurately tuned, a duct 32 is preferably used in conjunction with port 30, as shown in FIG. 3. More particularly, duct 32 is shown projecting from the outer surface of enclosure 16, in a direction substantially perpendicular to the longitudinal axis of the loudspeaker that passes through the center of drivers 12 and 14. In this arrangement port 30 is defined by the interface between duct 32 and the wall of enclosure 16.

Duct 32 is defined by four walls and has a rectangular cross section with a first width dimension $W_1$, measured parallel to the longitudinal axis of loudspeaker 10, and a second width dimension $W_2$, measured normal to the longitudinal axis. As shown in FIG. 3, the second width dimension $W_2$ of duct 32 is preferably equal to the diameter of enclosure 16 and is relatively large in comparison to the first width dimension $W_1$. Because duct 32 does not extend into enclosure 16 in the embodiment shown in FIG. 3, the intersection between duct 32 and the curved exterior of enclosure 16 causes the length of duct 32 to be a function of the point of measurement. The maximum length $L_1$ of duct 32 is measured adjacent the top and bottom walls of the duct, while the minimum length $L_1$ of duct 32 is measured along the side walls of duct 32 midway between the top and bottom walls.

The length of duct 32 is preferably selected to tune the loudspeaker 10 for resonance at 42 Hertz. The four walls defining duct 32 are typically considerably thicker than the wall of enclosure 16 and may, for example, be made of particle board. As will be appreciated, however, the material and thickness of the duct walls can be varied to influence the resonance of the enclosure 16 and duct 32.

In addition to the advantages previously described, the loudspeaker 10 illustrated in FIG. 3 has the advantage of emitting acoustic energy from a third plane. It should also be appreciated that, when the resultant loudspeaker 10 is employed in a vehicle as part of the vehicle's high fidelity system, the resultant T-shaped construction of the loudspeaker 10 significantly reduces its tendency to roll during changes in the vehicle's velocity, even when no external mounting devices are employed.

Figure 4:
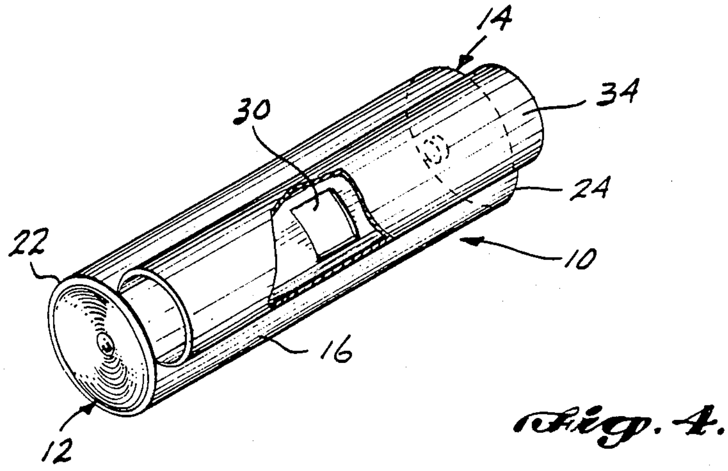
FIG. 4 is a pictorial view, in partial section, of another alternative embodiment of the loudspeaker illustrated in FIG. 1, including a port and a longitudinally extending duct for acoustically coupling the interior of the enclosure with the exterior of the enclosure.

In an alternative embodiment of loudspeaker 10, shown in FIG. 4, a tube-like duct 34 extends longitudinally the length of enclosure 16. This longitudinal duct 34 covers port 30 and is open at each end 22 and 24 of enclosure 16. Duct 34 forms a crescent-shaped passage between the port 30 and the exterior of the loudspeaker 10. The function of the longitudinal duct 34 is substantially the same as that of the perpendicular duct 30, described in conjunction with FIG. 3. While the material and thickness of the longitudinal duct 34 can conveniently be the same as that of enclosure 16, it will be appreciated that the type and thickness of the material, as well as the cross section and length of duct 34 can be adjusted to provide the desired resonance of the resultant loudspeaker 10.

In contrast to the arrangement illustrated in FIG. 3, the use of a longitudinal duct 34 limits the emission of acoustic energy from loudspeaker 10 to two relatively distinct points or planes. In addition, while the longitudinal duct 34 somewhat limits the tendency of loudspeaker 10 to roll in a moving vehicle, it is not as effective as the perpendicular duct 32 illustrated in FIG. 3.

Figure 5:
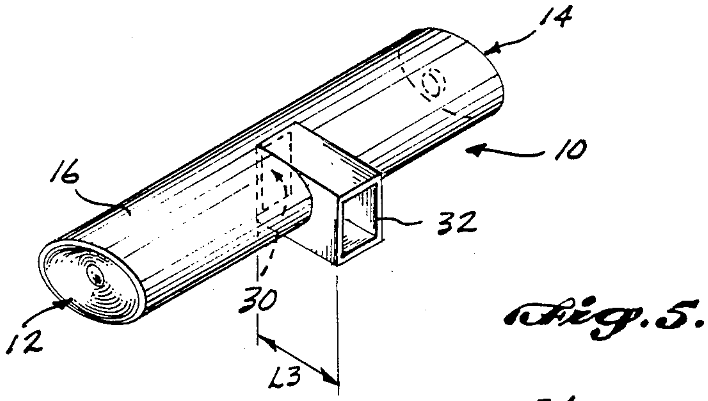
FIG. 5 is a pictorial view, in partial section, of an alternative embodiment of the loudspeaker illustrated in FIG. 3, wherein the enclosure has an elliptic cross section.
Figure 6:
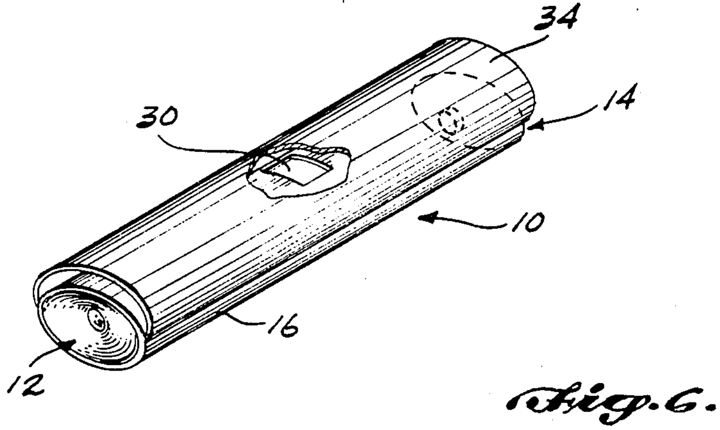
FIG. 6 is a pictorial view, in partial section, of an alternative embodiment of the loudspeaker illustrated in FIG. 4, wherein the enclosure has an elliptic cross section.

FIGS. 5 and 6 illustrate embodiments of loudspeaker 10 that roughly correspond to those depicted in FIGS. 3 and 4. The construction and operation of the depicted loudspeaker 10 is substantially in accordance with that described in connection with FIGS. 3 and 4. As will be appreciated from the figures, the primary difference between the illustrated arrangements is that the loudspeaker 10 illustrated in FIGS. 5 and 6 employ elliptic drivers 12 and 14, rather than the circular drivers illustrated in FIGS. 3 and 4. As a result, the enclosure 16 employed in the loudspeakers 10 of FIGS. 5 and 6 have a corresponding elliptic cross section.

An additional difference between the loudspeaker 10 illustrated in FIGS. 3 and 5 is that the duct 32 depicted in FIG. 5 has, for convenience, been constructed with four rectangular walls. The duct has a uniform length $L_3$ and, when attached to enclosure 16, extends both into, and out of, enclosure 16. In this arrangement, port 30 is defined by the inner opening of duct 32. As will be appreciated, while the use of a duct 32 constructed in the manner shown in FIG. 5 reintroduces flat reflective surfaces into the interior of enclosure 16, the reflective surfaces, which preferably do not comprise more than one-half of the cross-sectional area of enclosure 16, have not been found to unsuitably influence the response of loudspeaker 10.

Figure 7:
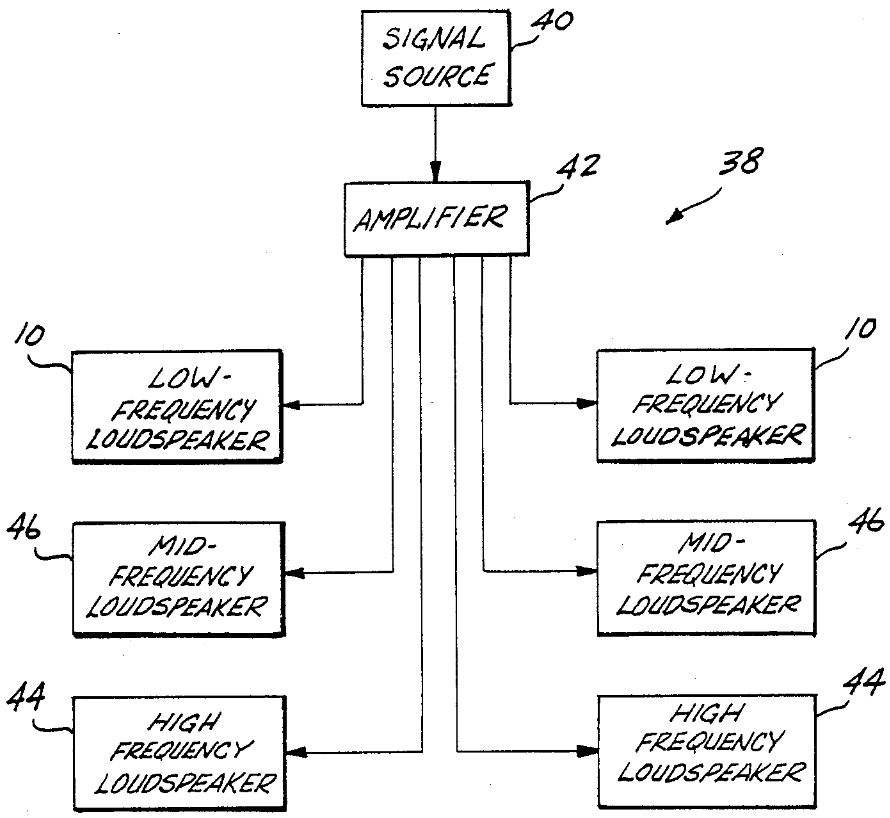
FIG. 7 is a block diagram illustrating a high fidelity audio system incorporating a pair of loudspeakers constructed in accordance with the invention.

A loudspeaker 10, constructed in the manner outlined above, has both an enhanced bass response and the advantages previously noted, making it desirable for use in a high fidelity audio system 38 illustrated in FIG. 7. In the arrangement shown, a signal source 40 produces a signal containing frequency and amplitude information that is characteristic of the original acoustic signal to be reproduced. This electric audio signal is input to an amplifier 42 which conditions the signal sufficiently to allow it to operate the various drivers in a speaker system. More particularly, in a stereo high-fidelity application, signals may be separately applied to a pair of high-frequency loudspeakers 44, a pair of mid-frequency loudspeakers 46, and a pair of the low-frequency loudspeakers 10 constructed in the manner described above. Alternatively, loudspeakers 10 may be used to supplement the response of an existing three-way speaker system. Preferably, the stereo low-frequency signals output by amplifier 40 are also separately applied to the drivers 12 and 14 in a single loudspeaker. This arrangement has the advantage of allowing one loudspeaker 10 to supplement the audio reproduction of an existing stereo system, conserving both space and expense.

Those skilled in the art will recognize that the embodiments of the invention disclosed herein are exemplary in nature and that various changes can be made therein without departing from the scope and spirit of the invention. In this regard, and as was previously mentioned, the invention is readily embodied with a variety of enclosure cross sections and duct constructions. Further, it will be recognized that the particular drivers selected, as well as the dimensions of the enclosure and duct, can be varied to alter the response of the loudspeaker. Because of the above and numerous other variations and modifications that will occur to those skilled in the art, the following claims should not be limited to the embodiments illustrated and discussed herein.

The embodiments of the invention in which an exclusive property or privilege is claimed are defined as follows:

1. A loudspeaker comprising:

an enclosure having first and second open ends and a port, located between said first and second open ends;

a duct, having four sides and a substantially rectangular cross section, projecting outward from said enclosure and extending from said port in a direction substantially perpendicular to the longitudinal axis of the enclosure, said duct having at least two sides that are substantially tangentially aligned with said enclosure, said duct and said port being for acoustically coupling the interior and exterior of said enclosure;

first driver means, secured to said first open end of said enclosure, for converting electric energy into acoustic energy; and second driver means, secured to said second open end of said enclosure, for converting electric energy into acoustic energy.

2. The loudspeaker of claim 1, wherein said enclosure has a substantially circular cross section.

3. The loudspeaker of claim 2, wherein said duct has a width, normal to the longitudinal axis of said enclosure, that is substantially equal to a diameter of said enclosure.

* * * * *